(12) United States Patent
Muramoto et al.

(10) Patent No.: US 6,459,034 B2
(45) Date of Patent: Oct. 1, 2002

(54) MULTI-JUNCTION SOLAR CELL (75) Inventors: Masahiko Muramoto, Kashiba (JP); Takashi Hayakawa, Kizu-cho (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/863,265

(22) Filed: May 24, 2001

(30) Foreign Application Priority Data

Jun. 1, 2000 (JP) ........................................ 2000-164988
Mar. 26, 2001 (JP) ........................................ 2001-088248

(51) Int. Cl.[7] ...................... H01L 31/052; H01L 31/042
(52) U.S. Cl. ...................... 136/249; 136/256; 136/261; 136/258; 136/244; 257/443; 257/431; 257/436
(58) Field of Search ................. 136/249, 256, 136/261, 258, 244; 257/443, 431, 436; 438/74

(56) References Cited

U.S. PATENT DOCUMENTS 5,853,497 A * 12/1998 Lillington et al. .......... 136/249
6,150,605 A * 11/2000 Han ........................... 136/263
6,153,823 A * 11/2000 Shiozaki et al. ............ 136/249
6,288,388 B1 * 9/2001 Zhang et al. ............. 250/214.1

FOREIGN PATENT DOCUMENTS

| JP | 1-289173 | 11/1989 |
| JP | 2738557 | 1/1998 |
| JP | 11-214728 | 8/1999 |
| JP | 2000-100483 A * | 4/2000 |

* cited by examiner

*Primary Examiner*—Alan Diamond
(74) *Attorney, Agent, or Firm*—Nixon & Vanderhye P.C.

(57) ABSTRACT

A multi-junction solar cell comprising: a support substrate having a first electrode layer, a plurality of photoelectric conversion devices and a second electrode layer stacked thereon, and an intermediate layer having an uneven surface being sandwiched between any two of the photoelectric conversion devices stacked adjacent each other.

22 Claims, 7 Drawing Sheets

MULTI-JUNCTION SOLAR CELL

CROSS-REFERENCES TO RELATED APPLICATIONS

This application is related to Japanese applications Nos. 2000-164988 and 2001-088248, filed on Jun. 1, 2000 and Mar. 26, 2001 whose priorities are claimed under 35 USC §119, the disclosures of which are incorporated by reference in their entirety.

BACKGROUND OF THE INVENTION

1. Field of the Invention

The present invention relates to a multi-junction solar cell. In particular, it relates to a multi-junction solar cell comprising a plurality of photoelectric conversion devices so as to utilize light of wide wavelength.

In this context, the multi-junction solar cell signifies a solar cell in which a plurality of photoelectric conversion devices are stacked along a direction of film thickness thereof and electrically connected in series.

The multi-junction solar cell includes an intermediate layer, which is a transparent conductive film inserted between the photoelectric conversion devices stacked along the film thickness direction and made of a material typically used as a transparent electrode in solar cells and liquid crystal displays.

2. Description of Related Art

Recently, a single junction solar cell utilizing a crystalline silicon substrate has been commercialized and widely shared the market. However, it involves problems of expensiveness of the crystalline silicon substrate and short of a silicon material supply.

Accordingly, there have been conducted research and development of an amorphous silicon solar cell in which a photoelectric conversion device comprising a thin amorphous silicon film is formed on an inexpensive substrate made of glass or metal.

The amorphous silicon solar cell, however, shows low photoelectric conversion efficiency as compared with that of the crystalline silicon solar cell. Further, its photoelectric conversion properties are gradually degraded by long-term irradiation of light which generates dangling bonds within the photoelectric conversion device (a so-called Staebler-Wronski effect). A prospect to overcome such drawbacks have not yet been in sight.

Also conventionally known is a multi-junction solar cell comprising a plurality of photoelectric conversion devices stacked on a single substrate and connected in series, the photoelectric conversion devices being made of substances having different forbidden band widths.

For example, commonly known is a multi-junction solar cell comprising a combination of photoelectric conversion devices made of amorphous silicon and those made of crystalline silicon (see Japanese Unexamined Patent Publication No. Hei 1 (1989)-289173).

In the thus constructed multi-junction solar cell, the photoelectric conversion devices are stacked in such order that the forbidden band widths thereof become greater as getting closer to a light receiving side of the solar cell so that light energy of wide wavelength is sufficiently extracted.

That is, the photoelectric conversion device absorbs photons having energies greater than its forbidden band width (Eg). Photons having energies lower than Eg are transmitted through the photoelectric conversion device, which will be a loss.

Therefore, by stacking the photoelectric conversion devices in the above-mentioned order, an energy loss is reduced, improving utilization efficiency of light per unit area.

Further, the multi-junction solar cell shows various advantages, e.g., higher open circuit voltage is obtained as compared with the single junction solar cell, degradation of solar cell properties is inhibited and so on. Thus, the multi-junction solar cell has eagerly been researched and developed as an effective possibility of realizing high efficiency and cost reduction.

At present, solar power generation will likely be a competition against other power generation systems such as thermal power generation and nuclear power generation. Accordingly, it is essential to achieve higher efficiency and lower costs in order to put it into wider use. In order to meet such demands, the following points need to be achieved:

1) Increase of a short circuit current density of the photoelectric conversion device determining a short circuit current density of the multi-junction solar cell itself;
2) Increase of an amount of light entering the multi-junction solar cell; and
3) Increase of open circuit voltage.

As a multi-junction solar cell considering the above-mentioned points, commonly known is a multi-junction solar cell in which a transparent conductive film is provided between two photoelectric conversion devices stacked in such order that the forbidden band widths thereof become bigger from a light receiving side of the solar cell (see Japanese Patent Publication No. 2738557).

In the multi-junction solar cell, a thickness of the transparent conductive film is appropriately selected. Accordingly, reflectance of a surface of the transparent conductive film is maximized with respect to a wavelength of light absorbable in the photoelectric conversion device located at the light receiving side, and it is lowered with respect to a wavelength of light absorbable in the photoelectric conversion device located at a side opposite to the light receiving side.

This multi-junction solar cell seems to be effective in view of the above-mentioned point (1), but does not in view of the above point (2). This is because of the photoelectric conversion device whose surface is not uneven, whereas it is known as an effective for efficient introduction of light to the inside of the multi-junction solar cell to provide the photoelectric conversion device located on the light receiving side of the multi-junction solar cell with an uneven surface (hereinafter referred to as a surface of the multi-junction solar cell).

With the uneven surface of the multi-junction solar cell, reflection of the incident light is inhibited and a greater amount of light is introduced into the solar cell. Therefore, light is utilized with higher efficiency.

Further, in the multi-junction solar cell provided with the uneven surface, there is a large difference in refractive index between a transparent electrode formed on the light receiving surface of the solar cell (typically having a refractive index of about 1.5 to 2) and the photoelectric conversion device (typically having a refractory index of about 4). Accordingly, the incident light is greatly refracted and an optical path thereof is lengthened within the photoelectric conversion device, which increases an amount of the incident light absorbed in the photoelectric conversion device. Thus, the thickness of the photoelectric conversion device can be reduced. Hereinafter, this phenomenon is referred to as a light trapping effect.

With the photoelectric conversion device having the thus reduced thickness, formation time for the photoelectric conversion device in a manufacture line is reduced. Further, carriers generated by light irradiation move a reduced distance within the photoelectric conversion device, so that probability of the carriers caught by the dangling bonds existing in the photoelectric conversion device is reduced, particularly in the photoelectric conversion device made of amorphous silicon. Moreover, an internal electric field within the photoelectric conversion device is enhanced, which also helps the inhibition of the degradation of the solar cell properties due to light irradiation.

Thus, providing the multi-junction solar cell with the uneven surface is very useful for achieving high efficiency and low costs of the multi-junction solar cell.

As an example of the multi-junction solar cell provided with the light receiving uneven surface, Japanese Unexamined Patent Publication No. Hei 11 (1999)-214728 discloses a multi-junction solar cell having an uneven surface. In the multi-junction solar cell, the uneven surface is provided in accordance with an uneven surface of a lower photoelectric conversion device of crystalline silicon which is spontaneously generated during its formation and an uneven surface provided on a rear electrode.

However, according to this technique, the configuration of the uneven surface of the multi-junction solar cell is dependent on that of the lower photoelectric conversion device and that of the rear electrode.

Accordingly, conditions for forming the lower photoelectric conversion device and the rear electrode are limited, which causes difficulty in simultaneously optimizing both the film quality and the uneven surface configuration of the multi-junction solar cell. In particular, the film quality of the crystalline silicon greatly influences the photoelectric conversion efficiency of the solar cell. Therefore, the thus limited film formation conditions are not desirable from a viewpoint of improvement of the photoelectric conversion efficiency of the multi-junction solar cell.

Typically, the multi-junction solar cell is comprised of a plurality of stacked photoelectric conversion devices, in which various parameters construct complicated combinations. Accordingly, an improvement of one component often results in degradation of properties of other components. That is, in the present situation, a construction allowing optimization of every component has not yet been achieved.

Therefore, for realizing higher efficiency of the multi-junction solar cell, it is extremely important to create the construction which allows optimization of each of the components interacting with each other.

SUMMARY OF THE INVENTION

In view of these circumstances, the present invention has been achieved to provide a multi-junction solar cell of high photoelectric conversion efficiency by simultaneously optimizing the film quality and the uneven surface configuration of the multi-junction solar cell.

The present invention provides a multi-junction solar cell comprising: a support substrate having a first electrode layer, a plurality of photoelectric conversion devices and a second electrode layer stacked thereon, and an intermediate layer having an uneven surface being sandwiched between any two of the photoelectric conversion devices stacked adjacent each other.

The present invention further provides a multi-junction solar cell comprising a first electrode layer, a plurality of photoelectric conversion devices provided on the first electrode layer, an intermediate layer having an uneven surface being sandwiched between any two of the photoelectric conversion devices stacked adjacent each other and a second electrode layer provided on the top of the photoelectric conversion devices, wherein at least one of the photoelectric conversion devices functions as a support substrate. That is, according to this constitution, one of the photoelectric conversion devices may be used as the support substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The uneven surface of the intermediate layer of the multi-junction solar cell according to the present invention is provided by surface treatment such as etching on the intermediate layer after the formation thereof.

A level difference in the uneven surface of the intermediate layer is set greater than that in the photoelectric conversion device lying below the intermediate layer.

In this context, the level difference signifies the maximum level difference between a highest portion and a lowest portion in a minuscule surface area (a several micrometer square to a several millimeter square) of the uneven surface.

Hereinafter the maximum level difference will be referred to as a surface level difference or Rmax.

The surface level difference of the intermediate layer may preferably be about 50 to 800 nm in view of the solar cell properties. More preferably, it may be about 80 to 400 nm.

It is required that the intermediate layer is formed of a light-transmissive conductive material. Examples of such a material include ITO (indium oxide containing several wt % of tin), tin oxide ($SnO_2$), zinc oxide (ZnO) and the like.

Among them, a zinc oxide based material which is highly resistible against reduction is particularly desirable since the intermediate layer will be exposed to hydrogen plasma during a later plasma enhanced CVD step for stacking a semiconductor layer thereon.

As to the first and second electrode layers, at least one of them formed on a light receiving side of the solar cell is light-transmissive.

Accordingly, the first and second electrode layers may be a light-transmissive layer or a lightproof layer. The light-transmissive layer may be formed of a light-transmissive conductive material such as ITO, $SnO_2$, ZnO or the like. The lightproof layer may be formed of metal such as aluminum, silver or the like. The lightproof layer may be formed of a layered structure of a light-transmissive conductive layer and a metal layer.

The surface level difference of the first electrode layer may preferably be about 5 to 150 nm, more desirably about 15 to 120 nm.

According to the multi-junction solar cell of the present invention, the plurality of photoelectric conversion devices comprise a first photoelectric conversion device containing crystalline silicon and a second photoelectric conversion device formed of amorphous silicon. The first photoelectric conversion device may be provided near the first electrode layer and the second photoelectric conversion device may be provided near the second electrode layer.

Crystalline silicon comprising the first photoelectric conversion device preferably has a crystalline orientation with respect to a direction vertical to a surface of the support substrate. When a plasma enhanced CVD method is employed for forming the photoelectric conversion device, the crystalline orientation of the grains tends to be directed to <110>.

In this case, a diffraction peak intensity of silicon at (220) is preferably 5 or more times greater than that at (111) as measured by an X-ray diffraction.

According to the present invention, the multi-junction solar cell is provided with an uneven surface by forming a level difference on the surface of the intermediate layer.

With such an effect of the intermediate layer, reflection of incident light on the surface of the multi-junction solar cell is restrained and an optical path of the incident light is lengthened within the photoelectric conversion device.

Since the configuration of the level difference of the surface of the multi-junction solar cell depends on that of the intermediate layer, conditions for forming the first electrode layer and the first photoelectric conversion device can be determined freely and appropriately.

Hereinafter, a correlation between the photoelectric conversion efficiency of the multi-junction solar cell and the surface level difference of the intermediate layer will be described with reference to experimental data shown in FIG. 6.

Figure 6:
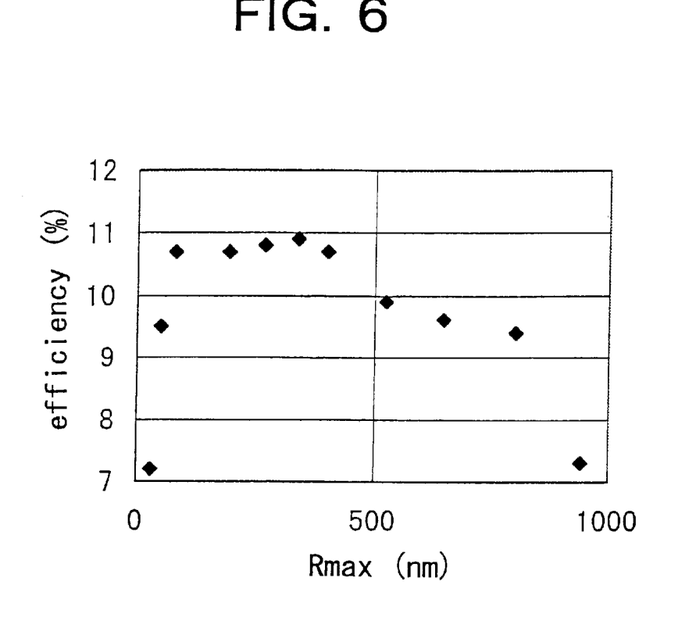
FIG. 6 is a graph illustrating a correlation between a surface level difference (Rmax) in an uneven surface of an intermediate layer and a photoelectric conversion efficiency of a multi-junction solar cell.

As seen in FIG. 6, where a value Rmax of the uneven intermediate layer surface is in the range of about 50 to 800 nm, the photoelectric conversion efficiency is relatively favorable. Particularly desirable photoelectric conversion efficiency is obtained when Rmax is in the range of about 80 to 400 nm.

Where Rmax decreases, light trapping effect is weakened and the photoelectric conversion efficiency decreases due to reduction of a short circuit current density. This occurs remarkably where Rmax is less than 50 nm. However, even if Rmax increases, it also causes decrease of the photoelectric conversion efficiency. In particular where Rmax exceeds 800 nm, as the surface of the intermediate layer is too rough, the photoelectric conversion device located thereon induces leak current. Consequently the solar cell properties are deteriorated.

Accordingly, Rmax of the surface of the intermediate layer is preferably in the range of about 50 to 800 nm, more preferably in the range of about 80 to 400 nm.

As a result of evaluation of solar cell properties of the photoelectric conversion devices made of crystalline silicon each formed on the underlying layers having various surface level differences, the following qualitative information is obtained.

According to the observation, open circuit voltage and fill factor of the crystalline silicon photoelectric conversion device are improved as the surface level difference of the underlying layer is reduced. However, the light trapping effect on the surface of the crystalline silicon solar cell and light scattering effect at an interface with the rear surface are deteriorated. Thus, it is found that the short circuit current density is reduced.

In the multi-junction solar cell, the photoelectric conversion devices are electrically connected in series. The short circuit current density of the solar cell is controlled and determined to the minimum short circuit current density of the photoelectric conversion devices. In contrast, the open circuit voltage is calculated as a sum of the open circuit voltages of each of the photoelectric conversion devices.

Under these circumstances, it is considered that even if the short circuit current density of one photoelectric conversion device, which is higher than those of other photoelectric conversion devices, is reduced, the properties of the multi-junction solar cell is not deteriorated. The properties would rather be improved by increasing the open circuit voltage of the photoelectric conversion devices.

For example, in the multi-junction solar cell in which crystalline silicon photoelectric conversion device and an amorphous silicon photoelectric conversion device are connected in series, the crystalline silicon photoelectric conversion device originally show a high short circuit current density and no behavior deteriorating the properties so that its thickness can considerably be increased. Accordingly, the short circuit current density can easily be increased as compared with the amorphous silicon photoelectric conversion device.

That is, it is considered that the improvement of the photoelectric conversion efficiency of the multi-junction solar cell can be achieved as a result of increase of the open circuit voltage by appropriately controlling the surface level difference of the layer below the crystalline silicon photoelectric conversion device in the range where the short circuit current density of the multi-junction solar cell is not deteriorated.

In the multi-junction solar cell according to the present invention, a level difference is formed on the surface of the intermediate layer to provide a level difference on the surface of the multi-junction solar cell for improvement of the light trapping effect. Therefore, the surface level difference of the layer below the crystalline silicon photoelectric conversion device, i.e., the first electrode layer, can be determined freely and appropriately.

Figure 7:
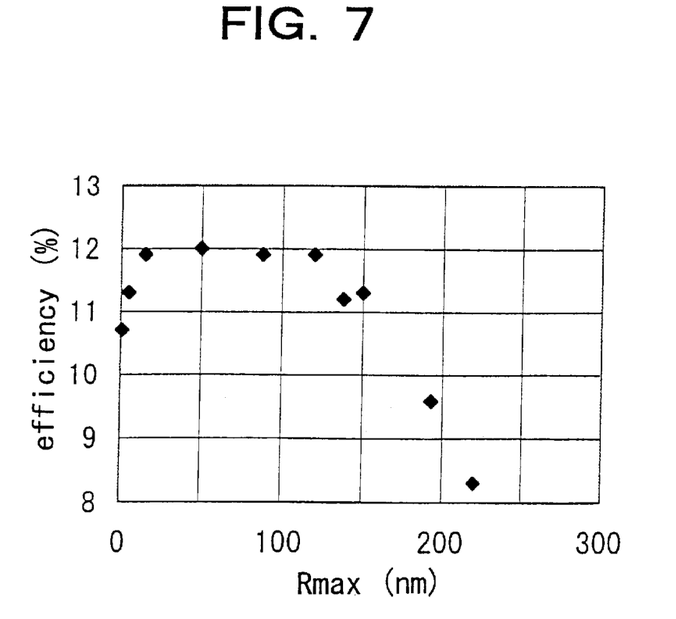
FIG. 7 is a graph illustrating a correlation between a surface level difference (Rmax) in an uneven surface of a first electrode layer and a photoelectric conversion efficiency of a multi-junction solar cell.

In view of the above consideration, FIG. 7 shows the photoelectric conversion efficiencies of the multi-junction solar cells wherein the surface level differences of the first electrode layers underlying the crystalline silicon photoelectric conversion layers are varied, respectively.

As a result, a desired range of the surface level difference of the first electrode layer is found.

Where a value Rmax of the first electrode layer surface is extremely small (less than 5 nm), light reached the first electrode layer without being absorbed is not scattered at the surface thereof and the short circuit current density of the crystalline silicon photoelectric conversion device is greatly reduced, which determines the short circuit current of the multi-junction solar cell. Thus, the short circuit current density of the multi-junction solar cell is greatly reduced.

Even in the case where the surface level difference on the first electrode is large, electrical properties of the crystalline silicon photoelectric conversion device are deteriorated. In particular, with Rmax greater than 150 nm, the properties rapidly decrease. It is considered that the decrease of the properties is caused by growth of crystalline silicon grains during the formation of the crystalline silicon photoelectric conversion device.

Figure 8:
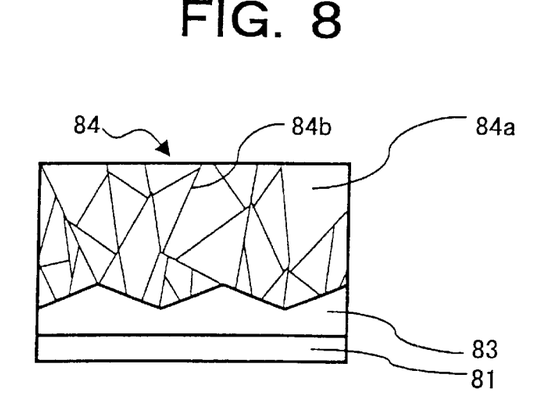
FIG. 8 is a view illustrating a correlation between grain boundaries generated in a thin crystalline silicon film and a surface level difference in an uneven surface of a layer below the thin crystalline silicon film.
Figure 9:
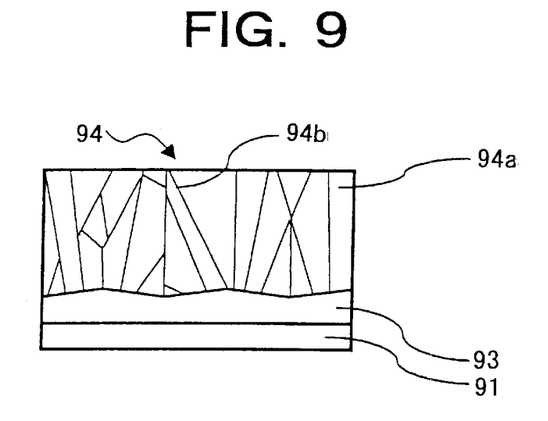
FIG. 9 is a view illustrating a correlation between grain boundaries generated in a thin crystalline silicon film and a surface level difference in an uneven surface of a layer below the thin crystalline silicon film.
Figure 10:
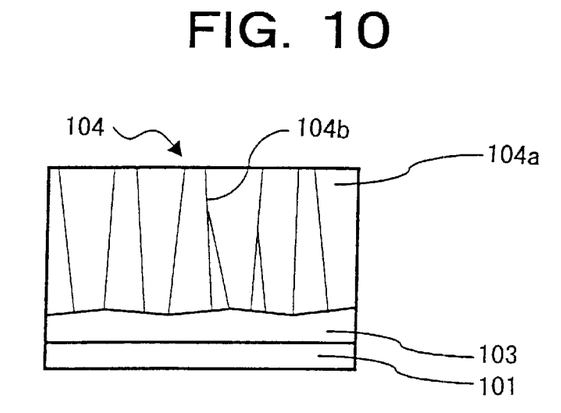
FIG. 10 is a view illustrating a correlation between a thin film of crystalline silicon oriented toward a direction of its film thickness and grain boundaries generated in the thin crystalline silicon film.

FIGS. 8 to 10 each illustrate a correlation among the surface level difference of the underlying layer, orientation of the crystalline silicon grains and grain boundaries generated in the crystalline silicon photoelectric conversion device.

As shown in FIG. 8, in the crystalline silicon photoelectric conversion device 84 formed by plasma enhanced CVD or the like, carriers generated by receiving optical energy are transported by a generated electrical field along a direction of the film thickness as indicated by an arrow.

Accordingly, it is desirable that crystalline silicon grains 84a comprising the crystalline silicon photoelectric conversion device 84 are grown in a direction vertical to the substrate 81 with less grain boundaries 84b running transversely to the film thickness direction. However, where the surface level difference of an underlying layer 83 is large, it causes the crystalline silicon grains 84a to grow in different directions, respectively. Therefore, the grains impact with each other during the crystal growth, which prevents them from growing in the vertical direction.

The grain boundaries 84b running transversely to the direction of the thickness of the silicon photoelectric conversion device are generated where the grains impact with each other. The construction of the crystalline silicon is disturbed in the grain boundaries 84b and numerous dangling bonds and amorphous components are found.

Accordingly, recombination of carriers frequently occurs in the crystalline silicon photoelectric conversion device 84 and non-uniform internal electric field significantly influences the transport properties of the carriers, which deteriorates the solar cell properties.

In particular, where the surface level difference of the underlying layer 83 is large as shown in FIG. 8, the crystalline silicon grains 84a do not equally grow along the film thickness direction, which decreases the electrical properties.

However, where the surface level difference of an underlying layer 93 is reduced as shown in FIG. 9, impact among crystalline silicon grains 94a is reduced, which decreases grain boundaries 94b. Thus, the film quality of a crystalline silicon photoelectric conversion device 94 and the solar cell properties are improved.

FIG. 10 shows a crystalline silicon photoelectric conversion device 104 wherein crystalline silicon grains 104a are grown on an underlying layer 103 under controlled conditions so that they grow along a certain direction.

In this case, growth of grain boundaries 104b due to the surface level difference on the underlying layer 103 as in the case of FIG. 9, as well as that due to the difference in growth rate of the crystalline silicon grains 104a having different crystalline orientations are inhibited.

That is, control of flatness of the underlying layer and the crystalline orientation of the crystalline silicon grains is useful in improving the film quality of the crystalline silicon photoelectric conversion device, which significantly improves the properties of the multi-junction solar cell.

Thus, it is desirable that the crystalline orientation of the crystalline silicon grains is vertical to the substrate. Where the crystalline orientation is directed to <110>, it is more desirable that a diffraction peak intensity ratio of (220)/(111) measured by an X-ray diffraction is about 5 or more.

According to the present invention, the level difference of the surface of the multi-junction solar cell formed depending on the level differences of the first electrode layer and the crystalline silicon photoelectric conversion device is controlled by the surface level difference on the intermediate layer.

Therefore, limitation to the surface level difference on the first electrode layer and conditions of forming the crystalline silicon photoelectric conversion device are eliminated. Further, the properties of the multi-junction solar cell can be more improved by selecting optimum conditions of forming the surface level difference on the first electrode layer and the crystalline silicon photoelectric conversion device.

The multi-junction solar cell of the present invention may include a light-transmissive substrate.

That is, the multi-junction solar cell according to the present invention may be applied as a superstrate type solar cell when the light-transmissive substrate is employed to introduce light from the support substrate, or a substrate type solar cell when it is constructed in such a manner that light enters from a side opposite to the substrate.

In the case of the superstrate type solar cell, at least the support substrate and the first electrode layer are light-transmissive. The second electrode layer may be light-transmissive or lightproof.

In the case of the substrate type solar cell, the second electrode layer needs to be light-transmissive. The support substrate and the first electrode layer may be light-transmissive or lightproof.

In order to prepare a multi-junction solar cell in which at least one of the photoelectric conversion devices serves as the support substrate, the photoelectric conversion device is formed of a polycrystalline silicon substrate or a monocrystalline silicon substrate.

In the case where the silicon substrate is used as the photoelectric conversion device, the surface level difference on the silicon substrate can be determined freely and appropriately. Preferable surface level difference on the silicon substrate is in the range of about 5 to 150 nm.

Even in the case of using the silicon substrate having a level difference on its surface, the surface of the multi-junction solar cell from which light enters can also be provided with the level difference as mentioned above, and thus similar effects are obtained.

Embodiments

Hereinafter, the present invention will be detailed by way of embodiments with reference to the figures, but the invention is not limited thereto.

Embodiment 1

Figure 1:
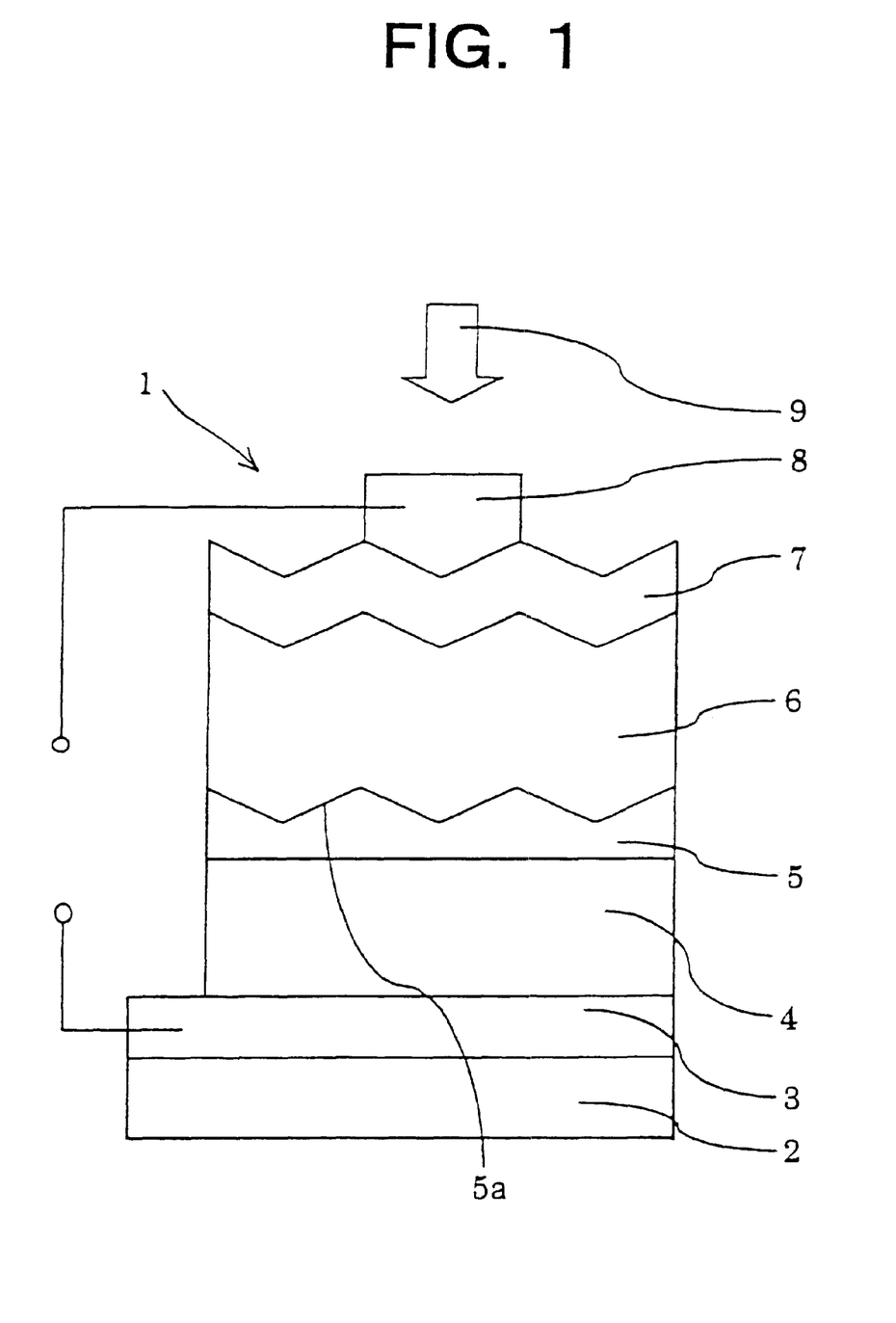
FIG. 1 is a sectional view illustrating a construction of a multi-junction solar cell according to Embodiment 1.

Referring to FIG. 1, a multi-junction solar cell according to Embodiment 1 of the present invention is described.

FIG. 1 shows a sectional view illustrating a construction of the multi-junction solar cell 1 of Embodiment 1.

electrode layer 3 using a plasma enhanced CVD apparatus to form the first photoelectric conversion device 4.

The formation of the first photoelectric conversion device 4 can be performed by heating the support substrate 2, applying electric power of high frequency between the support substrate and a cathode to generate plasma to obtain an intended thin crystalline silicon films.

Conditions of forming the thin crystalline silicon films each having the conductivity of n, i and p-type are described in Table 1.

TABLE 1

|  | Applied Power (W) | Gas pressure (Pa) | Substrate temperature (° C.) | Gas flow rate (sccm) | | | | Thickness (nm) |
| --- | --- | --- | --- | --- | --- | --- | --- | --- |
|  |  |  |  | Silane | Hydrogen | Phosphine | Diboran |  |
| n-layer | 70 | 13 | 220 | 4 | 100 | 0.0001 | — | 30 |
| i-layer | 52 | 26 | 220 | 20 | 800 | — | — | 2700 |
| p-layer | 70 | 26 | 220 | 8 | 450 | — | 0.0003 | 30 |

The multi-junction solar cell 1 is comprised of a first electrode layer 3, a first photoelectric conversion device 4, a second photoelectric conversion device 6 and a second electrode layer 7 stacked in this order on a support substrate 2. An intermediate layer 5 having an uneven surface is provided between the first and second photoelectric conversion devices 4 and 6.

Further, an auxiliary electrode 8 is provided on the second electrode layer 7. Light 9 is irradiated for measurement of solar cell properties.

A process of manufacturing the thus constructed multi-junction solar cell 1 will be explained below.

In this Embodiment, a glass substrate having a flat surface is used as the support substrate 2. However, the support substrate 2 may be a metal ceramic substrate, a silicon substrate or those provided with a metal film or an insulating film.

First, a glass substrate (7059, Corning Inc.) as the support substrate 2 is washed with pure water. Then, layers of silver and zinc oxide (ZnO) are formed as the first electrode layer 3 by electron beam evaporation.

The first electrode layer 3 is formed without providing a level difference on its surface.

The silver layer is formed in a thickness of about 100 nm by heating the substrate to about 180° C. and then irradiating electron beam to sterling silver. The ZnO layer is formed in a thickness of about 50 nm by heating the substrate to about 220° C. and then irradiating electron beam to a ZnO grain as an evaporation source under oxygen flow of about 42 sccm.

The first electrode layer 3 may be a single layer or a combined layer of a metal film or a conductive metal oxide film. The method for forming the first electrode layer is not limited to the above-mentioned vacuum evaporation, but known methods such as sputtering can also be used.

ZnO used herein may include dopants such as gallium (Ga), aluminum (Al), boron (B) and the like.

Then, thin crystalline silicon films each having a conductivity of n, i and p-type are successively formed on the first After the formation of the first photoelectric conversion device 4, the intermediate layer 5 is formed thereon. Examples of a material thereof include zinc oxide (ZnO), ITO (indium oxide containing several wt % of tin), tin oxide ($SnO_2$), and the like. Among them ZnO highly resistible against reduction is preferable. ZnO may contain dopants such as gallium (Ga), aluminum (Al), boron (B) and the like.

The intermediate layer may be formed by sputtering, vacuum evaporation or the like. In Embodiment 1, a ZnO film containing Ga is formed by sputtering.

The formation is performed in a sputtering apparatus by heating the support substrate 2 to about 200° C. and then applying DC bias of about 500V between the support substrate 2 and the cathode under argon pressure of about 0.7 Pa using zinc oxide doped with gallium as a sputter target.

The thus formed intermediate layer 5 has the surface level difference (Rmax) of about 42 nm. Then, the intermediate layer 5 is subjected to wet etching in an acetate solution of about 0.5 wt % for about 50 seconds to give further level difference on the surface 5a of the intermediate layer.

As a result, the surface level difference of the intermediate layer 5 is raised to 198 nm.

The method of providing the level difference on the intermediate layer 5 is not limited to the wet etching, but other methods such as dry etching are also available.

Thereafter, the second photoelectric conversion device 6 is formed on the intermediate layer 5 provided with the level difference on its surface. Amorphous silicon is used as a material of the second photoelectric conversion device 6. Forbidden band width of the amorphous silicon is wider than that of the crystalline silicon, so that it is suitably used as a photoelectric conversion device arranged at a side of the multi-junction solar cell from which light enters (a light receiving side).

As the amorphous silicon mentioned herein, may be used n- and p-type microcrystalline silicon in place of n- and p-type amorphous silicon used as a valence-controlled silicon material.

The second photoelectric conversion device 6 is formed with the same apparatus as used for forming the first photoelectric conversion device 4. Conditions for forming the second photoelectric conversion device 6 are described in Table 2 below.

TABLE 2

| | Applied Power (W) | Gas pressure (Pa) | Substrate temperature (° C.) | Gas flow rate (sccm) | | | | Thickness (nm) |
| --- | --- | --- | --- | --- | --- | --- | --- | --- |
| | | | | Silane | Hydrogen | Phosphine | Diboran | |
| n-layer | 25 | 40 | 200 | 180 | 300 | 0.0001 | — | 30 |
| i-layer | 30 | 66 | 200 | 40 | 130 | — | — | 400 |
| p-layer | 25 | 66 | 200 | 200 | 450 | — | 0.0003 | 20 |

After the formation of the second photoelectric conversion device 6, the second electrode layer 7 is formed thereon in a thickness of about 60 nm.

The second electrode layer 7 is formed of ITO by sputtering, wherein a substrate temperature is determined to about 220° C. in advance and then DC bias of about 450V is applied between the support substrate 2 and the cathode under oxygen flow of about 1.4 sccm, Ar flow of about 250 sccm and a gas pressure of about 3.8 Pa.

The surface level difference of the thus formed second electrode layer 7 is about 186 nm, which can reduce reflection of the light 9 on the surface of the multi-junction solar cell.

Thereafter, the auxiliary electrode 8 is formed in a thickness of about 300 nm.

The auxiliary electrode 8 is formed of silver by electron beam evaporation in a limited area using a metal mask provided on the substrate surface.

Temperature of the support substrate 2 is controlled to about 180° C. and electron beam is irradiated on sterling silver for melting.

The auxiliary electrode 8 is provided to complement the ability of the second electrode layer 7 to collect electric current. Materials of low resistance other than silver can be used.

The formation method is not limited to the vacuum deposition, but sputtering is also available.

Comparative Embodiment

A multi-junction solar cell (not shown) prepared as a comparative embodiment of the present invention will be described.

Different from the multi-junction solar cell of Embodiment 1, the level difference is not provided on a surface the intermediate layer of the comparative multi-junction solar cell. Other conditions and structure of the comparative multi-junction solar cell are the same as those of Embodiment 1.

The surface level difference of the multi-junction solar cell of Comparative Embodiment is about 37 nm.

Properties of the multi-junction solar cell of Embodiment 1 are measured by irradiating light 9 of AM 1.5 and 100 mW/cm$^2$ on the second electrode layer 7. The multi-junction solar cell of Comparative Embodiment is also measured under the same conditions. Results are shown in Table 3 below.

TABLE 3

| | Short circuit current density [mA/cm$^2$] | Open circuit voltage [V] | Fill factor [-] | Photoelectric conversion efficiency [%] |
| --- | --- | --- | --- | --- |
| Embodiment 1 | 13.0 | 1.21 | 0.682 | 10.7 |
| Comparative Embodiment | 10.2 | 1.20 | 0.680 | 8.3 |

The results show that a difference in short circuit current density is significant between Embodiment 1 and Comparative Embodiment. Thus, it is considered that the light trapping effect effectively works on the surface of the multi-junction solar cell by applying the present invention.

Embodiment 1 is directed to the multi-junction solar cell including two layers of the photoelectric conversion devices. However, providing the surface level difference on the intermediate layer is also effective in a multi-junction solar cell including three layers of the photoelectric conversion devices, exhibiting similar effects to those of Embodiment 1.

Embodiment 2

Figure 2:
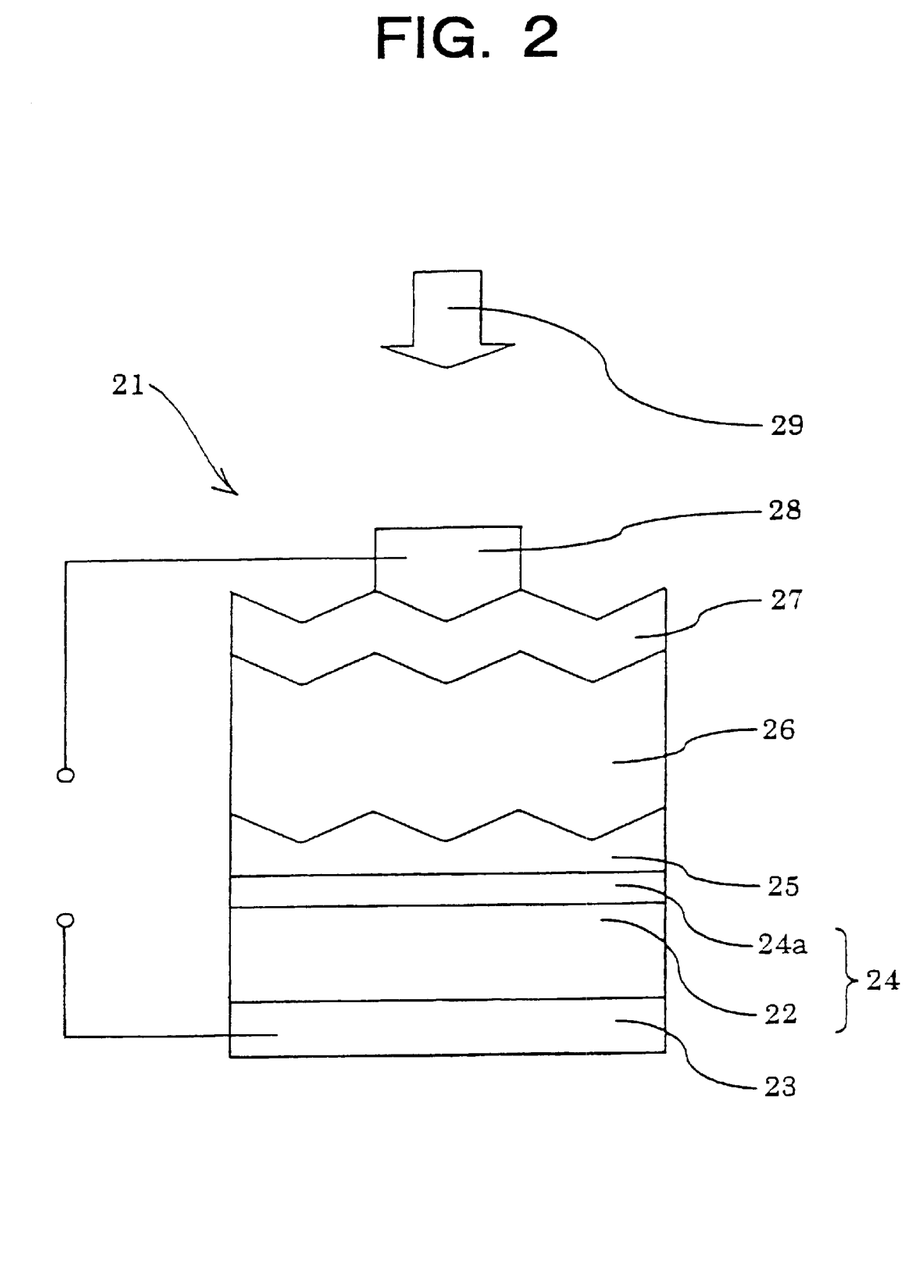
FIG. 2 is a a sectional view illustrating a construction of a multi-junction solar cell according to Embodiment 2.

Referring to FIG. 2, a multi-junction solar cell according to Embodiment 2 of the present invention will be described below.

FIG. 2 is a sectional view illustrating a construction of a multi-junction solar cell 21 according to Embodiment 2.

The multi-junction solar cell 21 is comprised of a first electrode layer 23, a first photoelectric conversion device 24, a second photoelectric conversion device 26 and a second electrode layer 27. The first photoelectric conversion device 24 serves as a support substrate and an intermediate layer 25 having an uneven surface is provided between the first and second photoelectric conversion devices 24 and 26.

In detail, a p-type semiconductor layer 24a is provided by diffusing boron in a surface region of an n-type semiconductor substrate 22. The first photoelectric conversion device 24 is comprised of the p-type semiconductor layer 24a and a n-type semiconductor substrate 22.

The first electrode layer 23 is stacked on a rear surface of the n-type semiconductor substrate 22 and an auxiliary electrode 28 is provided on a top surface of the second electrode layer 27.

Light 29 is irradiated for measurement of solar cell properties.

A process of manufacturing the thus constructed multi-junction solar cell 21 will be explained below.

An n-type polycrystalline silicon substrate containing phosphorus of about $10^{17}$ cm$^{-3}$ is used as the n-type semiconductor substrate 22. A monocrystalline silicon substrate is also applicable.

The n-type semiconductor substrate 22 is subjected to RCA wash to remove alkaline components and organic substances adhered to the surface thereof. Then, an organic material is applied to the surface of the n-type semiconductor substrate 22 facing to the first electrode layer 23 and the sides thereof. The organic material serves as a protection for preventing diffusion of boron used for forming the p-type semiconductor layer 24a into the surface region of the n-type semiconductor substrate 22 facing to the first electrode layer 23. The organic material is removed with an exfoliation liquid after the formation of the p-type semiconductor layer 24a.

The p-type semiconductor layer 24a is formed by gas diffusion, wherein the n-type semiconductor substrate 22 is heated in an oven and boron is diffused onto the surface region of the n-type semiconductor substrate 22 using $BBr_3$ as a diffusion source.

In addition to the gas diffusion, known methods of introducing/depositing/coating impurities such as ion implantation, plasma enhanced CVD and the like are also available.

Thereafter, the first electrode layer 23 is stacked on the rear surface of the n-type semiconductor substrate 22. The first electrode layer 23 is formed by electron beam evaporation using sterling silver as an evaporation source.

Other than silver, metal such as Ti, Al, Pd or an alloy thereof may be used to form the first electrode layer 23.

The first electrode layer 23 may be formed by any other known method than the electron beam evaporation.

After the first electrode layer 23 is stacked, the intermediate layer 25 is provided. Other steps of manufacturing the multi-junction solar cell are the same as described in Embodiment 1 and thus omitted.

Properties of the thus constructed multi-junction solar cell 21 are measured by irradiating light 29 of AM 1.5 and 100 mW/cm² on the second electrode layer 27. The results are shown in Table 4 below.

As a comparison, measurement is also performed to a comparative multi-junction solar cell formed in the same manner under the same conditions except that the level difference is not provided on the intermediate layer surface. The results are also shown in Table 4.

TABLE 4

|  | Short circuit current density [mA/cm²] | Open circuit voltage [V] | Fill factor [-] | Photoelectric conversion efficiency [%] |
| --- | --- | --- | --- | --- |
| Embodiment 2 | 13.1 | 1.37 | 0.698 | 12.4 |
| Comparative Embodiment | 10.3 | 1.35 | 0.692 | 9.6 |

The results show similar results to those obtained in Embodiment 1. That is, providing the surface level difference on the intermediate layer contributes to the light trapping effect on the surface of the multi-junction solar cell.

In a conventional manner, the light trapping effect on the surface of the multi-junction solar cell has been achieved by, prior to the formation of the p-type semiconductor layer 24a, providing a level difference by chemical etching or a mechanical process on the surface of the n-type crystalline silicon substrate 22 on which the p-type semiconductor layer 24a is to be formed.

In this stage, an area of a pn junction formed between the p-type semiconductor layer 24a and the n-type crystalline silicon substrate 22 becomes 1.5 to 2 times larger than that of a pn junction between a p-type semiconductor layer and an n-type crystalline silicon substrate having no level difference. Accordingly, in comparison between the multi-junction solar cells with the same light receiving areas, values of the short circuit current (Isc) are not so varied. However, since reversed saturation current ($I_0$) in a dark state is in proportion to the area of the pn junction, $I_0$ will increase when the level difference is provided.

Therefore, open circuit voltage of the multi-junction solar cell approximately represented as below:

$$Voc = nkT/q \ln(Isc/I_0+1) \tag{1}$$

(wherein n: diode coefficient, k: Boltzmann constant, T: temperature and q: charges of electrons) is reduced.

Further, in the case where the p-type semiconductor layer 24a is formed by deposition/coating, the n-type crystalline silicon substrate 22 having a large level difference is not fully covered, which induces leak current between the substrate 22 and the intermediate layer 25. That is, influenced are not only the solar cell properties but also yield.

In the present invention, configuration of the level difference required for the surface of the multi-junction solar cell depends on that of the intermediate layer surface. Therefore, the level difference on the surface of the crystalline silicon substrate does not necessarily configured as large as required for the surface of the multijunction solar cell. Even if the crystalline silicon substrate has a surface with a smaller level difference or a flat surface, the multi-junction solar cell excellent in the light trapping effect can be manufactured.

In Embodiment 2, the multijunction solar cell having two layers of the photoelectric conversion devices is employed. However, it is apparent that the present invention can also be applied to a multi-junction solar cell having three or more layers of the photoelectric conversion devices.

Embodiment 3

Embodiments 1 and 2 showed a construction in which the level difference is provided on the surface of the intermediate layer to enhance the light trapping effect and thus increase an amount of absorbed light. Thus, the present invention employs a construction where the level difference of the surface of the multi-junction solar cell is provided by the level difference on the intermediate layer surface.

This construction eliminates a need for controlling an amount of light entering the multi-junction solar cell by adjusting the surface level difference of a lower photoelectric conversion device (corresponding to the first photoelectric conversion device of the invention) comprising a first electrode layer and a crystalline silicon material, as performed in a conventional manner.

With the above-mentioned advantage, the multi-junction solar cell of Embodiment 3 will solve a problem of the crystalline silicon photoelectric conversion devices in conventional multi-junction solar cells.

The problem of the crystalline silicon photoelectric conversion devices is that if the level difference on the surface of the layer underlying the crystalline silicon photoelectric conversion device is large as seen in FIG. 8, lots of grain boundaries are generated in the crystalline silicon photoelectric conversion device, which prevents ideal transport of carriers generated by light irradiation.

Accordingly, by reducing the grain boundaries in the crystalline silicon photoelectric conversion device as shown in FIG. 9, the transport of the carriers improves, which enhances the solar cell properties.

The multi-junction solar cell according to Embodiment 3 is manufactured in accordance with a model as shown in FIG. 9. The photoelectric conversion efficiency of the multi-junction solar cell is further enhanced by optimizing the surface level difference on the first electrode layer to such a degree that the first photoelectric conversion device comprising crystalline silicon does not deteriorate the short circuit current density of the multi-junction solar cell.

The multi-junction solar cell of Embodiment 3 is described with reference to FIG. 3. A multi-junction solar cell 31 of Embodiment 3 is provided by forming a level difference on a surface of the first electrode layer 3 of the multi-junction solar cell 1 of Embodiment 1 (FIG. 1).

Figure 3:
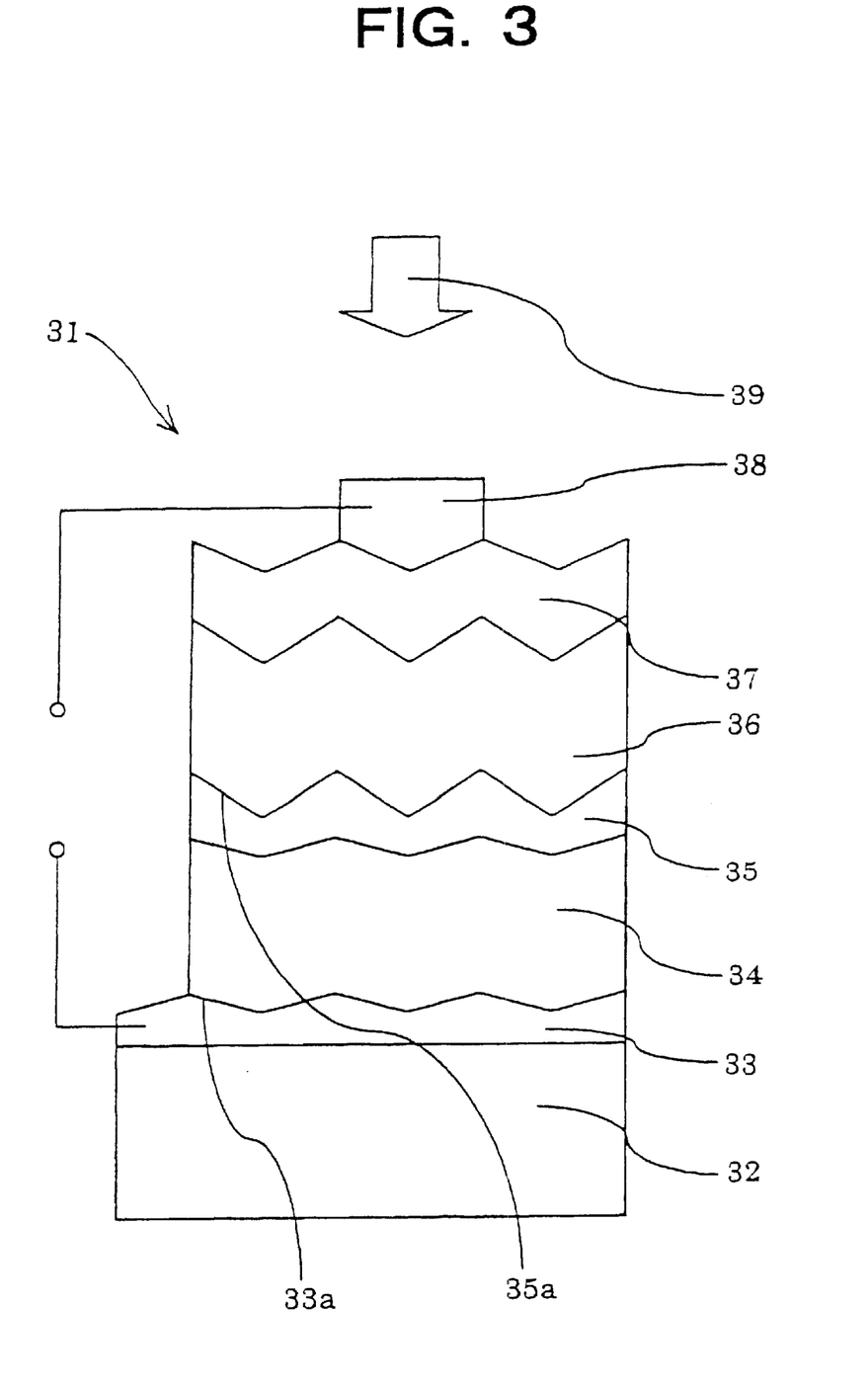
FIG. 3 is a a sectional view illustrating a construction of a multi-junction solar cell according to Embodiment 3.

FIG. 3 shows a sectional view illustrating a construction of the multi-unction solar cell 31 of Embodiment 3. The multi-junction solar cell 31 is comprised of a support substrate 32, a first electrode layer 33, a first photoelectric conversion device 34, an intermediate layer 35, a second photoelectric conversion layer 36 and a second electrode layer 37 stacked in this order. An auxiliary electrode 38 is provided on a top surface of the second electrode layer 37.

On the surfaces 33a and 35a of the first electrode layer 33 and the intermediate layer 35, level differences appropriate to the surface 33a and 35a are provided.

Light 39 is irradiated for measurement of solar cell properties.

The level difference on the surface 33a of the first electrode layer may be provided spontaneously by adjusting a thickness or forming conditions of the first electrode layer 33, or alternatively, by using a support substrate provided with the level difference on its surface in advance.

The first electrode layer 33 of Embodiment 3 is formed by heating the support substrate 32 having a flat surface (a glass substrate) to about 280° C., irradiating electron beam onto sterling silver above the heated glass substrate to form a silver film in a thickness of about 800 nm, and then forming thereon a ZnO film in a thickness of about 50 nm.

By forming the first electrode layer 33 under such conditions, the surface 33a of the first electrode layer 33 is provided with the level difference.

The surface level difference of the surface 33a of the first electrode layer is about 50 nm.

On the thus formed first electrode layer 33, the first photoelectric conversion device 34, the intermediate layer 35, the second photoelectric conversion device 36, the second electrode layer 37 and the auxiliary electrode 38 are formed to complete the multi-junction solar cell 31.

Measurement results of properties of the multi-junction solar cell 31 are shown in Table 5 below. Measurement conditions are the same as those in Embodiment 1.

TABLE 5

|  | Short circuit current density [mA/cm$^2$] | Open circuit voltage [V] | Fill factor [-] | Photoelectric conversion efficiency [%] |
| --- | --- | --- | --- | --- |
| Embodiment 3 | 13.0 | 1.32 | 0.698 | 12.0 |

The results show that the solar cell properties are further enhanced by providing the appropriate level deference with the surface 33a of the first electrode layer 33.

This effect is not particular to the multi-junction solar cell 31 of Embodiment 3, but is also shown in, for example, a multi-junction solar cell including three or more layers of the photoelectric conversion devices.

Embodiment 4

A multi-junction solar cell according to Embodiment 4 is described with reference to FIG. 4.

Figure 4:
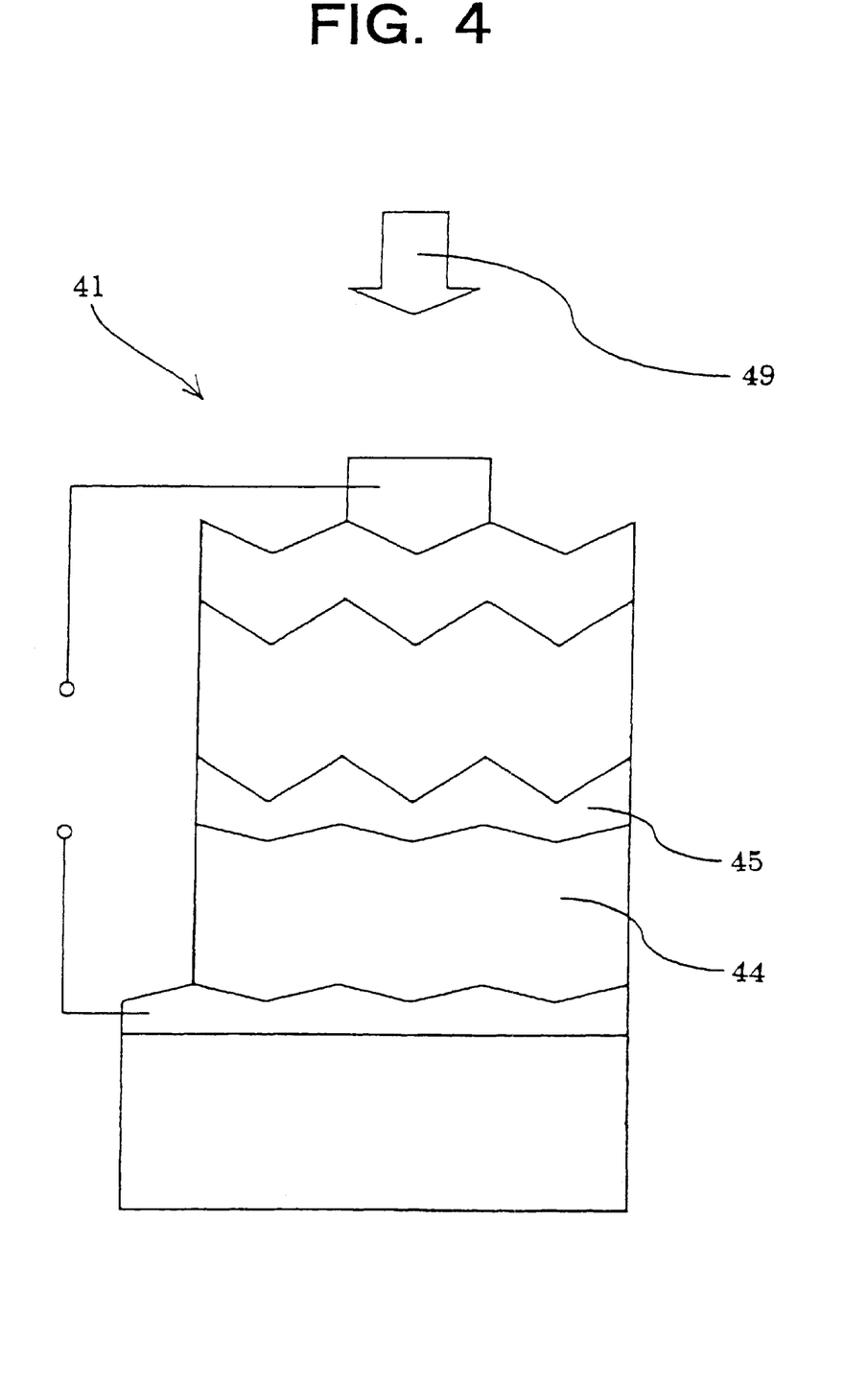
FIG. 4 is a sectional view illustrating a construction of a multi-junction solar cell according to Embodiment 4.

FIG. 4 shows a sectional view illustrating a construction of the multi-junction solar cell 41 of Embodiment 4.

The multi-junction solar cell of Embodiment 4 is constructed in the same manner as that of Embodiment 3 (FIG. 3) except that conditions for forming a first photoelectric conversion device 44 are varied.

In detail, varied are conditions of plasma enhanced CVD for forming an i-type thin crystalline silicon film comprising the first photoelectric conversion device 44 together with n- and p-type thin crystalline silicon films.

Accordingly, crystalline silicon grains comprising the i-type thin crystalline silicon film will have a crystalline orientation vertical to the substrate surface. Thus, the grain boundaries within the i-type thin crystalline silicon film are reduced.

That is, in the multi-junction solar cell 41 of Embodiment 4, the first photoelectric conversion device 44 is formed in accordance with a model as shown in FIG. 10 to improve the solar cell properties.

Hereinafter, conditions for forming the i-type thin crystalline silicon film comprising the first photoelectric conversion device 44 together with the n- and p-type thin crystalline silicon films are described. Conditions for forming the n- and p-type thin crystalline silicon films are the same as those in Embodiment 3 and thus omitted.

Plasma enhanced CVD conditions for forming the i-type thin crystalline silicon film are performed under silane flow of about 6 sccm, hydrogen flow of about 300 sccm, gas pressure of about 65 Pa, applied power of about 52 W and a substrate temperature of about 220° C. The thickness of the i-type thin crystalline silicon film is about 2700 nm.

Other constructions and conditions of the multi-junction solar cell 41 are the same as those of Embodiment 3 and thus omitted.

The surface level difference of the intermediate layer 45 in the multi-junction solar cell 41 according to Embodiment 4 is substantially the same as that of Embodiment 3.

Therefore, it is noted that in comparison between Embodiments 3 and 4, the solar cell properties of the solar cell 41 of Embodiment 4 are not influenced by the surface level difference on the intermediate layer 45 of Embodiment 4.

The multi-junction solar cell 41 is irradiated with light 49 in the same manner as in Embodiment 3 to measure the solar cell properties. As a result, values as shown in Table 6 are obtained, which indicates that open circuit voltage and fill factor are improved as compared with Embodiment 3.

TABLE 6

|  | Short circuit current density [mA/cm$^2$] | Open circuit voltage [V] | Fill factor [-] | Photoelectric conversion efficiency [%] |
| --- | --- | --- | --- | --- |
| Embodiment 4 | 13.1 | 1.36 | 0.708 | 12.6 |

Further, crystalline orientation of the crystalline silicon grains comprising the first photoelectric conversion device 44 with respect to a direction vertical to the substrate surface is measured by an X-ray diffraction. The results show that a diffraction peak intensity at (220) is extremely high as compared with other diffraction peaks of silicon. The ratio of (220)/(111) is 5.0.

The X-ray diffraction is useful in observing the crystalline orientation of the growing crystalline silicon grains with respect to the vertical direction of the substrate surface.

In comparison between the X-ray diffraction results of the first photoelectric conversion device 44 of Embodiment 4 and those of the photoelectric conversion device 34 of Embodiment 3 (showing the ratio of (220)/(111)=1.6), it is found that the crystalline silicon grains oriented toward the vertical direction to the substrate surface are deposited to form the first photoelectric conversion device 44 of Embodiment 4.

From the comparison, it is concluded that the solar cell properties are remarkably improved by providing the crystalline silicon grains comprising the crystalline silicon photoelectric conversion device with a preferential crystalline orientation toward the vertical direction to the substrate surface, i.e., a direction of transporting the carriers.

Crystalline silicon grains comprising the p- and n-type thin crystalline silicon films preferably have the same crystalline orientation of that of the i-type thin crystalline silicon film. The p- and n-type thin crystalline silicon films can be formed under the same conditions as the i-type thin crystalline silicon film.

It is apparent that the effects obtained in Embodiment 4 can also be achieved in other multi-junction solar cells if they include at least a crystalline silicon photoelectric conversion device.

Embodiment 5

A multi-junction solar cell according to Embodiment 5 of the present invention is described with reference to FIG. 5.

Figure 5:
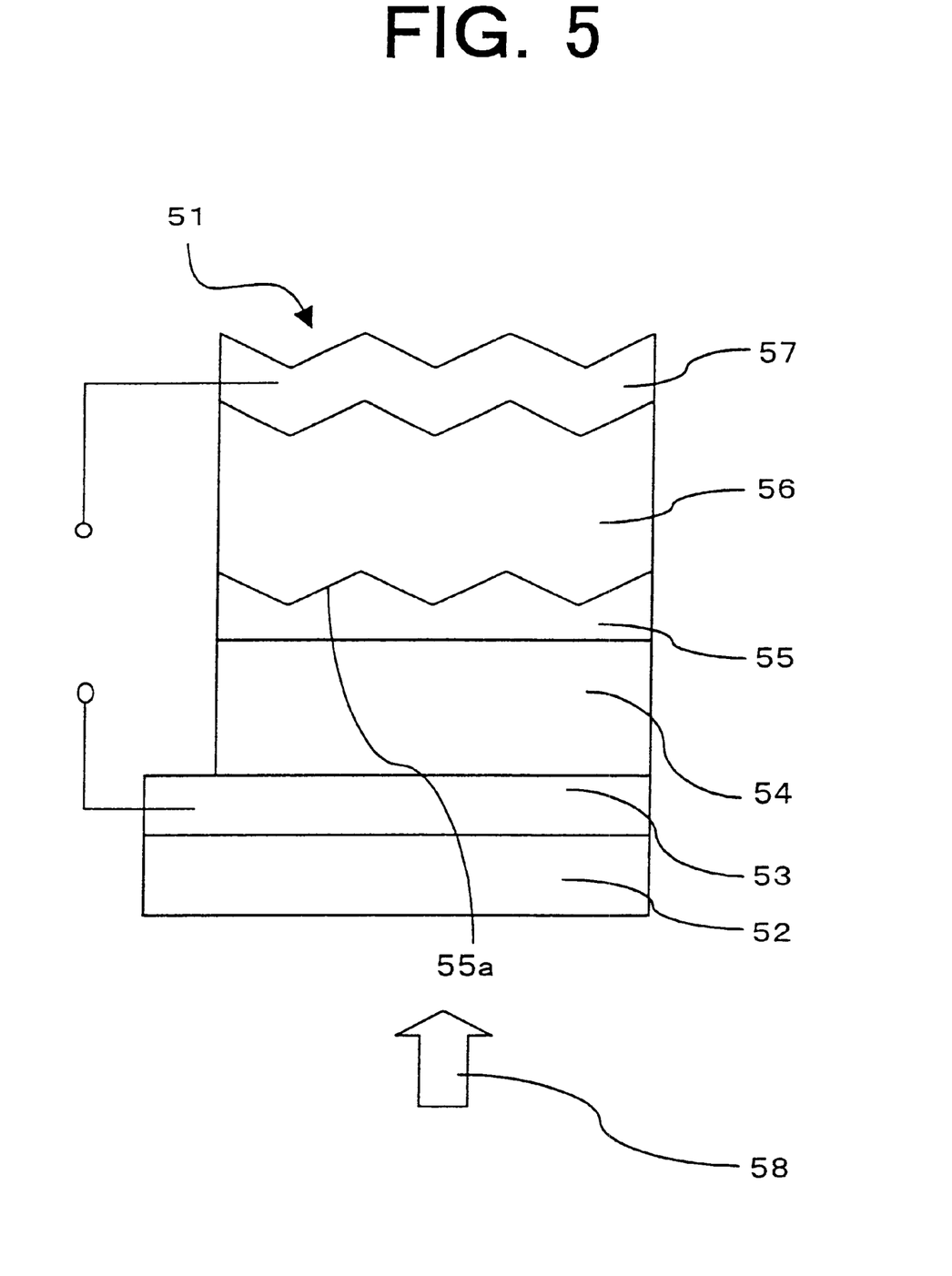
FIG. 5 is a sectional view illustrating a construction of a multi-junction solar cell according to Embodiment 5.

FIG. 5 is a sectional view illustrating a construction of a multi-junction solar cell 51 of Embodiment 5.

The multi-junction solar cell 51 is comprised of a first electrode layer 53, a first photoelectric conversion device 54, a second photoelectric conversion device 56 and a second electrode layer 57 stacked in this order on a support substrate 52. An intermediate layer 55 having a level difference on its surface is provided between the first and second photoelectric conversion devices 54 and 56. Light 59 is irradiated for measurement of solar cell properties.

A process of manufacturing the thus constructed multi-junction solar cell 51 will be explained below.

In the explanation, a glass substrate having a flat surface is used as the support substrate 52. However, the support substrate 52 may be other light-transmissive substrates than the glass substrate.

First, a glass substrate (7059, Corning Inc.) as the support substrate 52 is washed with pure water and then the first electrode layer 53 is formed by electron beam evaporation with zinc oxide (ZnO). Level difference is not provided on the surface of the first electrode layer 53.

The first electrode layer 53 is formed in a thickness of about 50 nm by heating the substrate to about 220° C. and then irradiating electron beam onto a ZnO source as an evaporation source under oxygen flow of about 42 sccm.

The first electrode layer 53 may preferably be a light-transmissive conductive film made of ZnO, tin oxide, ITO and the like. It may be a single layer or a combined layer. The film formation method is not limited to the above-mentioned vacuum evaporation but a known method such as sputtering may be used. The first electrode layer 53 may contain dopants such as gallium (Ga), aluminum (Al) and boron (B).

Then, thin amorphous silicon films each having p-, i- and n-type conductivity are formed successively on the first electrode layer 53 using a plasma enhanced CVD apparatus to provide the first photoelectric conversion device 54. Conditions for forming the thin amorphous silicon films are the same as shown in Table 2 except that the order of the layers is changed to p, i, n.

The amorphous silicon mentioned herein may be n- and p-type microcrystalline silicon in place of n- and p-type amorphous silicon used as a valence-controlled silicon material. The obtained thin amorphous silicon film has a surface level difference of about 36 nm.

After the formation of the first photoelectric conversion device 54, the intermediate layer 55 is stacked thereon. The intermediate layer 55 may be formed of a single layer or a combined layer of light-transmissive materials such as ZnO, ITO, tin oxide and the like. However, ZnO which is resistible against reduction is particularly preferable since the intermediate layer will be exposed to plasma containing hydrogen in a later step. The materials for the intermediate layer may contain dopants.

The intermediate layer may be formed by sputtering, vacuum evaporation or the like. In this embodiment, a ZnO film containing gallium is formed by sputtering. In detail, it is formed by heating the support substrate 52 to about 200° C. in a sputtering apparatus and then applying DC bias of about 500V between the support substrate 52 and a cathode while using zinc oxide doped with Ga as a target under argon pressure of about 0.7 Pa. The surface level difference (Rmax) of the thus formed intermediate layer 55 is about 35 nm. Thereafter, to provide a greater level difference, the intermediate layer 55 is subjected to wet etching in an acetate solution of about 0.5 wt % for about 50 seconds. As a result, the surface level difference of the surface 55a of the intermediate layer increases to about 188 nm.

This treatment for providing the greater level difference is not limited to wet etching, but other means such as dry etching may be used. After this treatment, the second photoelectric conversion device 56 is formed on the intermediate layer 55 provided with the level difference. The second photoelectric conversion device 56 is made of microcrystalline silicon. It is formed with the same apparatus used for forming the first photoelectric conversion device 54 under the same conditions as shown in Table 1 except that the stacking order of the thin microcrystalline silicon films is changed to p, i, n and the thickness of the i-layer is 2.0 μm.

After the formation of the second photoelectric conversion device 56, an ITO film of about 60 nm thick and a silver film of about 500 nm are stacked as the second electrode layer 57. The ITO film is formed by sputtering wherein the support substrate 52 is heated to about 220° C. and then DC bias of about 450V is applied between the support substrate 52 and a cathode under oxygen flow of about 1.4 sccm, Ar flow of about 250 sccm and gas pressure of about 3.8 Pa. The thus formed ITO film has the surface level difference of about 186 nm.

The silver film is formed by heating the support substrate 52 to about 180° C. and then irradiating electron beam on an evaporation source of sterling silver for melting. Thus, the multi-junction solar cell is completed.

The second electrode layer 57 preferably has a layered structure of a transparent conductive film and a metal film as mentioned above, but it may be constructed of the metal film only.

A multi-junction solar cell (not shown) prepared as a comparative embodiment of the multi-junction solar cell of Embodiment 5 will be described hereinafter. Different from the solar cell of Embodiment 5, the intermediate layer in the comparative multi-junction solar cell is not provided with the surface level difference. Other constructions and formation conditions of the comparative multijunction solar cell are the same as those of the multi-junction solar cell of Embodiment 5. The ITO film of the comparative multijunction solar cell has a spontaneously generated surface level difference of about 33 nm.

Properties of the thus constructed multi-junction solar cell of Embodiment 5 are measured by irradiating light 59 of AM 1.5 and 100 nW/cm$^2$ on the support substrate. The comparative multi-junction solar cell is also measured under the same conditions. Results are shown in Table 7 below.

TABLE 7

| | Short circuit current density [mA/cm$^2$] | Open circuit voltage [V] | Fill factor [-] | Photoelectric conversion efficiency [%] |
|---|---|---|---|---|
| Embodiment 5 | 12.5 | 1.18 | 0.680 | 10.0 |
| Comparative Embodiment | 9.8 | 1.15 | 0.675 | 7.6 |

The results apparently show that the multi-junction solar cell of Embodiment 5 having the level difference on the surface 55a of the intermediate layer is more effective. In the present invention, the first electrode layer 53 is not provided with the level difference, but it may be provided with the level difference in an appropriate range.

It is considered that the amorphous silicon and the crystalline silicon may be varied in the appropriate surface level difference due to the difference in refractive index thereof.

In a conventional manner, the surface level difference on the first electrode layer 53 determines the surface level differences of the amorphous silicon and the crystalline silicon, respectively, so that appropriate surface level difference of each of them is not obtained. In the present invention, the surface level difference of each of them is independently determined by controlling the surface level difference on a light receiving side of the amorphous silicon (providing a level difference on the surface 55a of the intermediate layer) and controlling the surface level difference on a light receiving side of the crystalline silicon (providing a level difference on the surface of the first electrode layer 53). Thus, the photoelectric conversion efficiency higher than that of the conventional one is obtained.

In this Embodiment, a multi-junction solar cell including two layers of the photoelectric conversion devices is employed. However, it is apparent that the similar effects can be obtained by a multi-junction solar cell including three or more layers of the photoelectric conversion devices.

According to the present invention, the intermediate layer having the level difference on its surface is sandwiched between any two of the photoelectric conversion devices stacked adjacent each other, and the surface of the multi-junction solar cell is provided with the level difference by the level difference of the intermediate layer. Therefore, the film quality of the photoelectric conversion device and the configuration of the level difference on the surface of the multi-junction solar cell are optimized, which improves the photoelectric conversion efficiency of the multi-junction solar cell.

What is claimed is:

1. A multi-junction solar cell comprising:
    a support substrate having a first electrode layer, a plurality of photoelectric conversion devices and a second electrode layer stacked thereon,
    an intermediate layer having an uneven surface being sandwiched between any two of the photoelectric conversion devices stacked adjacent each other, and
    wherein the electrode layer on a light receiving side of the intermediate layer is continuous and has an uneven surface.

2. A multi-junction solar cell according to claim 1, wherein the uneven surface of the intermediate layer is formed by etching the intermediate layer after the formation thereof.

3. A multi-junction solar cell according to claim 1, wherein the photoelectric conversion device lying below the intermediate layer has an uneven surface, wherein a maximum level difference in the uneven surface of the intermediate layer is greater than that of the photoelectric conversion device below the intermediate layer.

4. A multi-junction solar cell according to claim 1, wherein a maximum level difference in the uneven surface of the intermediate layer is in the range of 50 to 800 nm.

5. A mult-junction solar cell according to claim 1, wherein the support substrate includes a light-transmissive substrate.

6. A multi-junction solar cell comprising:
    a support substrate having a first electrode layer, a plurality of photoelectric conversion devices and a second electrode stacked thereon,
    an intermediate layer having an uneven surface being sandwiched between any two of the photoelectric conversion devices stacked adjacent each other, and
    wherein the intermediate layer comprises zinc oxide.

7. A multi-junction solar cell comprising:
    a support substrate having a first electrode layer, a plurality of photoelectric conversion devices and a second electrode layer stacked thereon,
    an intemediate layer having an uneven surface being sandwiched between any two of the photoelectric conversion devices stacked adjacent each other, and
    wherein the first electrode layer has an uneven surface and a maximum level difference in the uneven surface of the first electrode layer is in the range of 5 to 150 nm.

8. A multi-junction solar cell comprising:
    a support substrate having a first electrode layer, a plurality of photoelectric conversion devices and a second electrode layer stacked thereon,
    an intermediate layer having an uneven surface being sandwiched between any two of the photoelectric conversion devices stacked adjacent each other, and
    wherein the plurality of photoelectric conversion devices comprise a first photoelectric conversion device comprising crystalline silicon and a second photoelectric conversion device comprising amorphous silicon, wherein the first photoelectric conversion device is provided near the first electrode layer and the second photoelectric conversion device is provided near the second electrode layer.

9. A multi-junction solar cell according to claim 8, wherein the first photoelectric conversion device contains crystalline silicon having a crystalline orientation with respect to a direction vertical to a surface of the support substrate.

10. A multi-junction solar cell according to claim 9, wherein the first photoelectric conversion device contains crystalline silicon having a crystalline orientation of <110>.

11. A multi-junction solar cell according to claim 10, wherein the first photoelectric conversion device shows a diffraction peak intensity of silicon at (220) which is 5 or more times greater than a diffraction peak intensity at (111) as measured by an X-Ray diffraction.

12. A multi-junction solar cell comprising:
    a first electrode layer, a plurality of photoelectric conversion devices provided on the first electrode layer, an intermediate layer having an uneven surface being sandwiched between any two of the photoelectric conversion devices stacked adjacent each other and a second electrode layer provided on the top of the photoelectric conversion devices, wherein at least one of the photoelectric conversion devices functions as a support substrate, and wherein the electrode layer on a light receiving side of the intermediate layer is continuous and has an uneven surface.

13. A multi-junction solar cell according to claim 12, wherein the uneven surface of the intermediate layer is formed by etching.

14. A multi-junction solar cell according to claim 12, wherein the photoelectric conversion device lying below the intermediate layer has an uneven surface, wherein a maximum level difference in the uneven surface of the intermediate layer is greater than that of the photoelectric conversion device below the intermediate layer.

15. A multi-junction solar cell according to claim 12, wherein a maximum level difference in the uneven surface of the intermediate layer is in the range of 50 to 800 nm.

16. A multi-junction solar cell comprising:

a first electrode layer, a plurality of photoelectric conversion devices provided on the first electrode layer, an intermediate layer having an uneven surface being sandwiched between any two of the photoelectric conversion devices stacked adjacent each other and a second electrode layer provided on the top of the photoelectric conversion devices, wherein at least one of the photoelectric devices functions as a support substrate, and wherein the intermediate layer is formed of zinc oxide.

17. A multi-function solar cell comprising:

a first electrode layer, a plurality of photoelectric conversion devices provided on the first electrode layer, an intermediate layer having an uneven surface being sandwiched between any two of the photoelectric conversion devices stacked adjacent each other and a second electrode layer provided on the top of the photoelectric conversion devices, wherein at least one of the photoelectric conversion devices functions as a support substrate, and wherein the plurality of photoelectric conversion devices comprise a first photoelectric conversion device containing crystalline silicon and a second photoelectric conversion device formed of amorphous silicon, wherein the first photoelectric conversion device is provided near the first electrode layer and the second photoelectric conversion device is provided near the second electrode layer.

18. A multi-junction solar cell according to claim 17, wherein the first photoelectric conversion device comprises one of a polycrystalline silicon substrate and a monocrystalline silicon substrate.

19. A multi-junction solar cell according to claim 17, wherein the first photoelectric conversion device has an uneven surface.

20. A multi-junction solar cell according to claim 19, wherein a maximum level difference in the uneven surface of the first photoelectric conversion device is in the range of 5 to 150 nm.

21. A multi-junction solar cell comprising:

a support substrate having a first electrode layer, a plurality of photoelectric conversion devices and a second electrode layer stacked thereon, an intermediate layer having an uneven surface being sandwiched between any two of the photoelectric conversion devices stacked adjacent each other, and wherein the intermediate layer comprisies a metal oxide.

22. A multi-junction solar cell comprising:

a support substrate having a first electrode layer, a plurality of photoelectric conversion devices and as second electrode layer stacked thereon, an intemediate layer having an uneven surface being sandwiched between any two of the photoelectric conversion devices stacked adjacent each other, and wherein the electrode layer on a light receiving side of the intermediate layer has an upper uneven surface.

* * * * *